United States Patent [19]
Warwick

[11] 3,979,682
[45] Sept. 7, 1976

[54] HYSTERESIS COMPENSATOR FOR CONTROL SYSTEMS

[75] Inventor: Thomas R. Warwick, Jupiter, Fla.

[73] Assignee: United Technologies Corporation, Hartford, Conn.

[22] Filed: Dec. 11, 1974

[21] Appl. No.: 531,635

[52] U.S. Cl. .............................. 328/162; 328/158; 328/172; 328/154
[51] Int. Cl.² ........................................ H03K 17/10
[58] Field of Search .......... 328/152, 154, 158, 162, 328/164, 172, 71, 115; 307/264

[56] References Cited
UNITED STATES PATENTS

| | | | |
|---|---|---|---|
| 3,553,595 | 1/1971 | Walsh | 307/235 N |
| 3,602,825 | 8/1971 | Senior | 328/115 |
| 3,654,560 | 4/1972 | Cath et al. | 328/162 |
| 3,699,948 | 10/1972 | Ota et al. | 307/264 |
| 3,735,273 | 5/1973 | Wright et al. | 328/162 |
| 3,898,573 | 8/1975 | Sherman | 307/264 |

Primary Examiner—John S. Heyman
Attorney, Agent, or Firm—M. P. Williams

[57] ABSTRACT

A hysteresis compensator reduces the effects of a dead zone induced error in the actuation of a controlled device in response to a control signal. A bias is applied to the uncompensated control signal in a summing network, the direction of the bias being determined by the direction of the control signal. As a result of the bias, the desired action of the controlled device is such that its amplitude is directly related to the amplitude of the control signal. The compensator is described in connection with proportional, integral and derivative controls.

4 Claims, 5 Drawing Figures

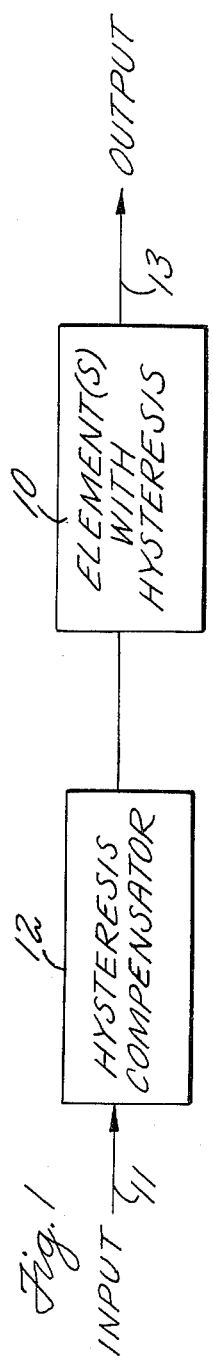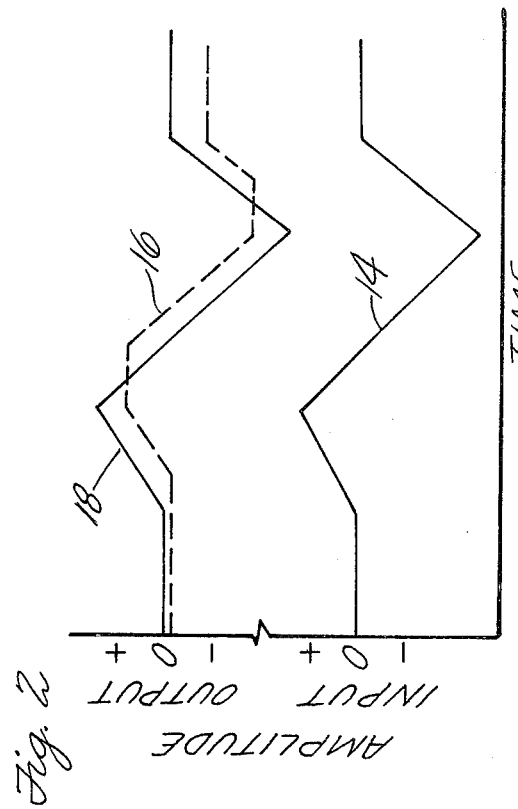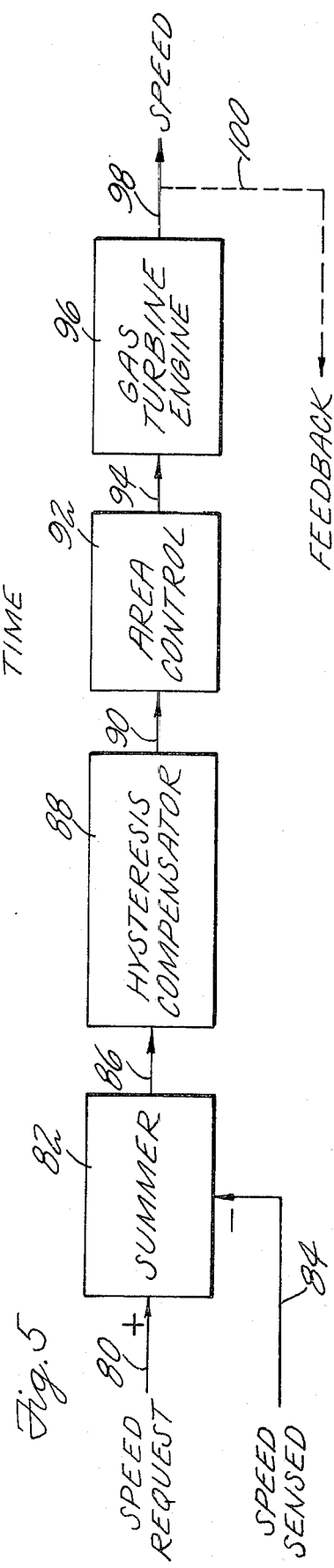

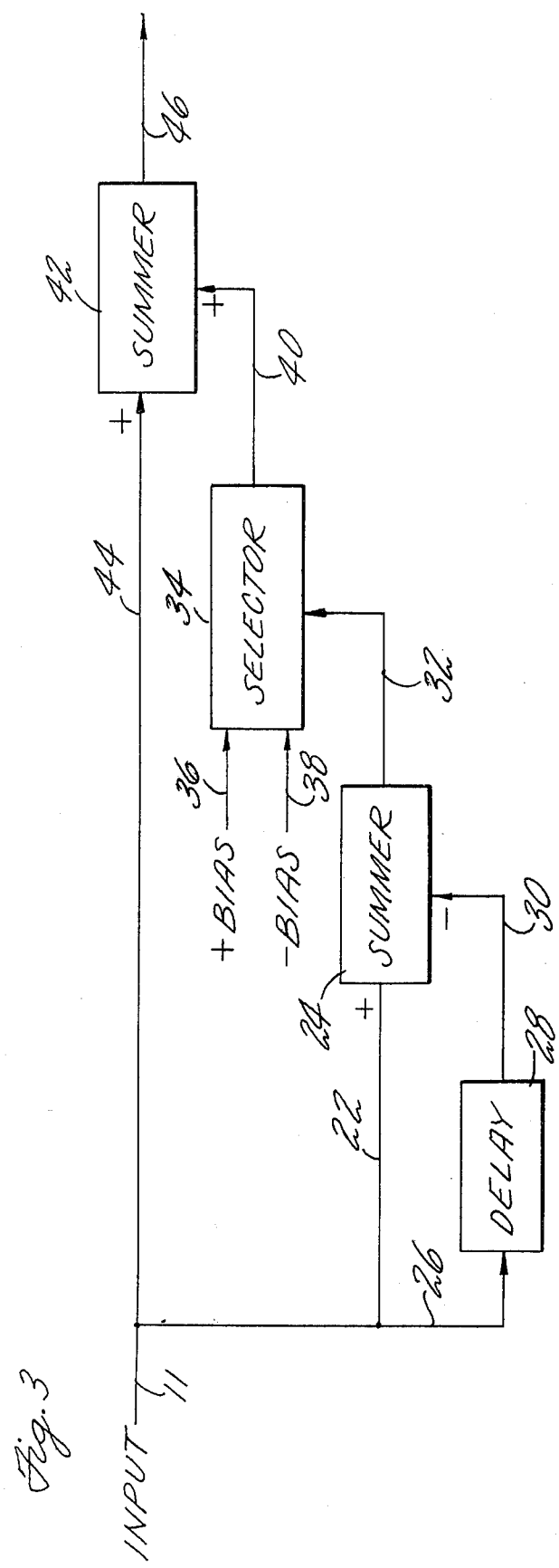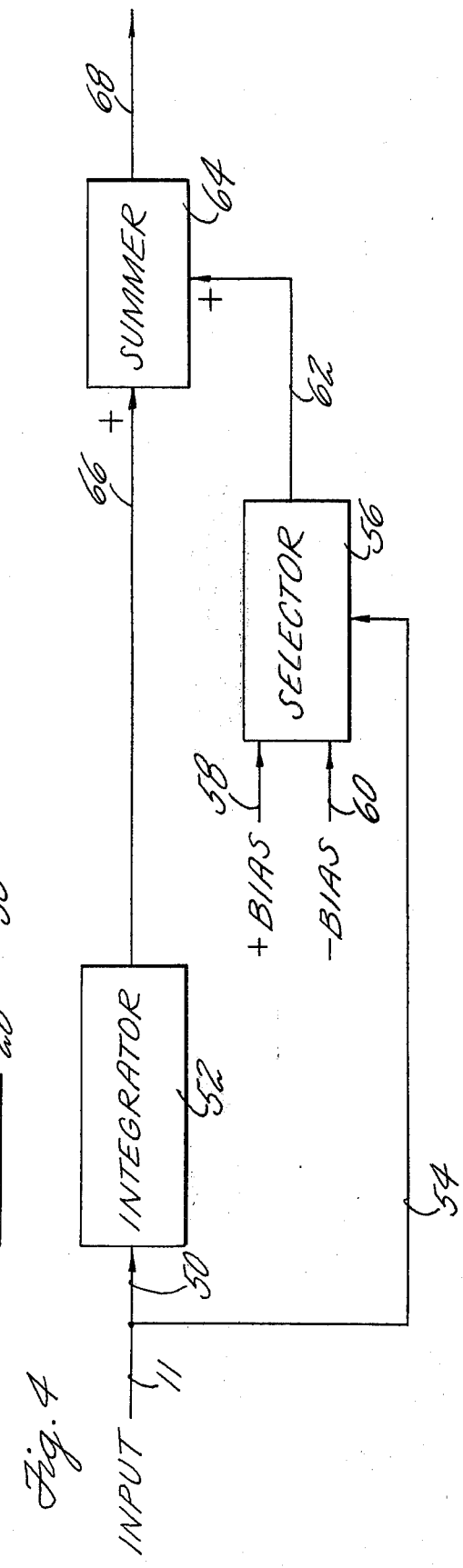

HYSTERESIS COMPENSATOR FOR CONTROL SYSTEMS

The invention herein described was made in the course of or under a contract or subcontract there under with the Department of the Air Force.

BACKGROUND OF THE INVENTION

1. Field of the Invention

This invention relates to a method and apparatus for compensating a control system to eliminate the undesirable hysteresis which causes an error in the actuation of a controlled device in response to a control signal.

2. Description of the Prior Art

Hysteresis can cause erratic action in a control system in that the amplitude of the output of the system is not directly related to the amplitude of the input. In control systems such as in turbine engines where the output drives a mechanical device, there can be a substantial error in the response of the controlled device in response to a request signal.

Complete removal of hysteresis from a control system is not usually possible as a result of the many different elements each of which contribute hysteresis within the control system. One method of compensating for hysteresis used in the prior art is the application of a high frequency, low amplitude signal which is superimposed on the input signal to mask the hysteresis dead zone. This prior art technique has a disadvantage in that the duty cycle of the control system increases together with accompanying output fluctuations.

A particular problem with control systems having hysteresis is the fact that the output or controlled device does not immediately follow the commands of the input signal whenever the input changes direction. A dead zone occurs each time that there is a reversal in the direction of the input signal.

The present invention overcomes the disadvantages of the prior art and provides a novel method and apparatus for overcoming the hysteresis dead zone in the control systems. Whenever the input changes direction, a bias is applied to the input in a direction such that the hysteresis dead zone is overriden. As a result, the amplitude of the output is directly related to the amplitude of the input.

SUMMARY OF THE INVENTION

In accordance with a preferred embodiment of the present invention, the uncompensated control signal, which may be an error signal produced by comparing the requested value with the actual value of a variable of operation, is fed to a summing network. The uncompensated control signal is also fed through a delay network and the delayed uncompensated signal is algebraically subtracted from the original uncompensated signal in the summing network. The resultant difference signal is then fed to a selector network which selects either a positive or negative bias signal in response to the sign of the difference signal. The selected bias signal is then added to the uncompensated control signal in a second summing network to thereby compensate the control signal for the effects of hysteresis.

The hysteresis compensator of the present invention may be used in any type of control system, proportional, integral or derivative, or combinations thereof.

In accordance with an alternative embodiment of the present invention, hysteresis compensation may be applied to an integral control signal without the necessity of using a delay network. Because the output of an integrator follows its input, it is possible to select the proper bias signal in response to the sign of the input to the integrator, thereby eliminating the delay network required when derivative or proportional controls are used.

The present invention will be described in terms of a turbine engine control, but it should be noted that the teachings of the present invention are applicable to any control system. Likewise, the hysteresis compensator of the present invention can be implemented with electrical or electronic elements that are analog, digital or both, as well as hydraulic, pneumatic, mechanical or other means known to those skilled in the art.

BRIEF DESCRIPTION OF THE DRAWINGS

FIG. 1 is a schematic block diagram showing the location of the hysteresis compensator in a control system.

FIG. 2 shows in graph form the relationship of the amplitude of the input and output of a control system both with and without the hysteresis compensator.

FIG. 3 is a schematic diagram of the preferred implementation of the hysteresis compensator.

FIG. 4 is a schematic of an alternative embodiment of the hysteresis compensator used in an integral control.

FIG. 5 is a schematic of the use of hysteresis compensator in a gas turbine speed control.

DESCRIPTION OF THE PREFERRED EMBODIMENT

There is shown in FIG. 1 a typical control system in which an input signal 11 is fed into the control system and a resultant output signal 13 is produced. The control signal 11 may be a proportional, derivative or integral signal or any combination thereof. Block 10 illustrates an element or elements in the control system which produce hysteresis. These elements are typically linkages, cams, actuators, servomotors, or other similar devices which act in response to the input signal to transmit the output signal. Such devices typically produce a hysteresis response of the output signal to changes in the input signal. In practicing the present invention, the hysteresis compensation shown at block 12 is positioned between the input 11 and the block 10 which contains the elements which produce the hysteresis. The hysteresis compensator 12 as will be explained in detail responds to changes in the input signal 11 and produces a bias to the input signal which effectively circumvents hysteresis by in effect "overdriving" the elements within block 10.

In FIG. 2 there is shown in graph form a triangular input signal 14 which may be the input 11 to the control of FIG. 1. As a result of hysteresis the output signal shown at 16 does not follow the input signal, there being a time lagged amplitude error in the response of the output signal to changes in the input signal. Line 18 shows the response of the output signal with changes in the input signal when the hysteresis compensator of the present invention is used. As may be seen, the output signal follows the input signal in a precise manner.

Referring to FIG. 3 there is shown the preferred embodiment of the hysteresis compensator 12 of FIG. 1. The uncompensated input signal 11 is fed via line 22 to a summing network 24 and also via line 44 to a second summing network 42. The uncompensated signal is also fed via line 26 to a delay network 28 where the uncompensated input signal is delayed in time. The delayed signal is then fed via line 30 to summing network 24 where it is subtracted from the uncompensated input signal. By delaying the input signal in delay network 28, changes in the direction of the signal on line 44 are reflected in the sign of the output of summing network 24. For example, if the uncompensated input signal is increasing in magnitude, the delayed uncompensated signal on line 30 is smaller than the uncompensated input signal on line 22, and the sign of the output from the summing network 24 on line 32 is positive. Conversely, if the uncompensated input signal is decreasing in magnitude, the delayed uncompensated signal on line 30 is larger than the uncompensated input signal, and the sign of the output on line 32 from the summing network 24 is negative.

The output from summing network 24 is fed via line 32 to a selector network 34. Also fed to selector network 34 are a positive bias signal on line 36 and a negative bias signal on line 38. Depending upon the sign of the difference signal on line 32, either the positive or negative bias signal will be fed through selector network 34 and via line 40 as an input to the second summing network 42. A positive difference signal on line 32 selects the positive bias signal on line 36, and conversely a negative difference signal on line 32 selects the negative bias signal on line 38.

The uncompensated input signal fed via line 44 as an input to second summing network 42 has the bias signal on line 40 added thereto to produce the compensated signal on line 46. The compensated signal is then fed as an input to block 10 of FIG. 1, that is, the elements in the control system which contain hysteresis now have as an input thereto a compensated input signal rather than an uncompensated input signal. The compensation in the form of the bias signal is in a direction which will "overdrive" the elements which contain hysteresis and cause a more precise actuation of these elements. In this manner, the output from the control system follows the input without the time lagged amplitude error associated with hysteresis.

As noted previously, the input signal 11 in FIG. 3 may be either a proportional, integral or derivative control signal, or any combination thereof. Because of the unique nature of integral controls, it is possible to implement the hysteresis compensator in an integral control in a somewhat different manner than described in FIG. 3

FIG. 4 shows a modification of the hysteresis compensator which may be used with an integral control system. In this embodiment, the uncompensated input signal 11 is fed via line 50 to an integrator 52, and is also fed via line 54 to a selector network 56. The integrated uncompensated input signal is fed from integrator 52 to summing network 64 via line 66. Lines 58 and 60 contain the positive and negative bias signals respectively which are also fed as inputs to selector network 56. In this embodiment the selector network 56 responds to the sign of the uncompensated input signal. Changes in the direction of the integrated signal on line 66 are reflected in the sign of the uncompensated input signal. For example, if the integrated signal on line 66 is increasing, the sign of the uncompensated input signal is positive. If the integrated signal on line 66 is decreasing, the sign of the uncompensated input signal is negative. A positive signal on line 54 selects the positive bias signal on line 58, and conversely a negative signal on line 54 selects the negative bias signal on line 60. The selected bias signal is then fed from selector 56 via line 62 to summing network 64 where it is added to the uncompensated integrated signal fed to summing network 64 via line 66. The compensated integrated signal appears on line 68. In this embodiment the delay 28 and summer 24 network of FIG. 3 have been eliminated.

A gas turbine engine speed control which utilizes the hysteresis compensator of the present invention is shown in FIG. 5. A speed request signal, which may for example be produced by the action of the pilot of an aircraft using a gas turbine engine, is fed via line 80 to a summing network 82. Also fed to summing network 82 is a signal indicative of the actual gas turbine speed on line 84. The summing network 82 compares the speed request signal with the actual or sensed speed signal and produces therefrom a speed error signal which appears on line 86.

In several typical gas turbine engine applications, speed is controlled by varying the area of a nozzle in the gas turbine engine. The speed error signal on signal line 86 may be used to vary the area of the nozzle. A proportional, integral or derivative, or combination thereof, control network, not shown, may be used with a function generator, also not shown, to convert the speed error signal into the area request signal.

The speed error signal 86, shown in FIG. 5 as an uncompensated area request signal, is fed to a hysteresis compensator 88 which preferably takes the form shown in FIGS. 3 or 4. The output of the hysteresis compensator 88 is the compensated area request siganl shown on line 90.

The compensated area request signal on line 90 is then fed to the nozzle area control shown in block 92 which typically takes the form of a servomotor or actuator. The area control 92, in response to the compensated area request signal, regulates the area of the nozzle by increasing or decreasing the area. This change in the nozzle area is shown schematically by signal line 94. A change in the nozzle area effects many parameters in the gas turbine engine illustrated at 96 and varies the speed of the gas turbine engine. This change in actual or sensed speed shown on line 98 is then fed back via line 100 in typical closed loop control systems to signal line 84 to close the control loop.

Application of the hysteresis compensator is not limited to speed controls as shown in FIG. 5. Other applications of the hysteresis compensator are in a turbine temperature control in which the fuel supplied to a turbine engine is varied in response to the turbine temperature, or in position controls for compressor inlet variable vanes or rear compressor variable vanes. Other examples and uses for the hysteresis compensator are apparent to those skilled in the art.

It will be apparent to those skilled in the art that the bias signal which is used to compensate the input signal need not be fixed but may be a variable bias signal whose variation is determined either by the uncompensated input signal or in response to some other parameter. Other modifications of the present invention will also be apparent to those skilled in the art.

I claim:

1. In a control in which a control signal for a controlled device is produced in response to changes in an input signal, a time lag occurring in the response of said controlled device to changes in said input signal due to hysteresis in said control system, the improvement comprising:

an integrator, said input signal being connected to the input of said integrator, the output of said integrator changing in a direction determined by the polarity of said input signal;

a first source of a fixed bias signal having a first polarity and a second source of a fixed bias signal having a polarity opposite to said first polarity;

summing means having a pair of inputs and providing an output signal as a function of the summation of signals applied to its inputs, one of said inputs being connected to the output of said integrator; and selector means connected to said input signal and responsive to the polarity thereof for connecting a corresponding one of said bias signal sources to the other input of said summing means, whereby the output of said summing means will be increased in value over the output of said integrator by the magnitude of said bias signals in response to a positive input signal and the output of said summing means will be decreased below the value of the output of said integrator by the magnitude of said bias signals in response to a negative input signal.

2. In a control in which a control signal for a controlled device is produced in response to changes in an input signal, a time lag occurring in the response of said controlled device to changes in said input signal due to hysteresis in said control system, the improvement comprising:

a delay unit connected to said input signal and providing an output signal delayed therefrom;

a first summing means having a positive input thereto connected to said input signal and having a negative input thereto connected to the delayed output signal of said delay unit, the output of said first summing means providing a signal the polarity of which is a function of the direction of change of said input signal; and a first source of a fixed bias signal having a first polarity and a second source of a fixed bias signal having a polarity opposite to said first polarity;

second summing means having a pair of inputs and providing an output signal as a function of the summation of signals applied to its inputs, one of said inputs being connected to said input signal; and selector means connected to the output of said first summing means and responsive to the polarity thereof for connecting a corresponding one of said bias signal sources to the other input of said second summing means, whereby the output of said second summing means will be increased in value over said input signal by the magnitude of said bias signals in response to a positive input signal and the output of said second summing means will be decreased from the value of said input signal by the magnitude of said bias signals in response to a negative input signal.

3. In a control in which a control signal for a controlled device is produced in an integrator in response to changes in an input signal, a time lag occurring in the response of said controlled device to changes in the integral of said input signal due to hysteresis in said control system, the method comprising:

providing a first fixed bias signal having a first polarity and a second fixed bias signal having a polarity opposite to said first polarity;

selecting one of said bias signals in response to the polarity of said input signal; and summing the output of said integrator with the selected bias signal to provide said control signal, whereby said control signal will be increased in value over the output of said integrator by the magnitude of said bias signals in response to a positive input signal and said control signal will be decreased from the value of the output of said integrator by the value of said bias signals in response to a negative input signal.

4. In a control in which a control signal for a controlled device is produced in response to changes in an input signal, a time lag occurring in the response of said controlled device to changes in said input signal due to hysteresis in said control system, the method comprising:

delaying said input signal and providing an output signal delayed therefrom;

combining said input signal and said delayed signal in a summing means to provide a signal the polarity of which is indicative of the direction of change of said input signal;

providing a first fixed bias signal having a first polarity and a second fixed bias signal having a polarity opposite to said first polarity; and summing said input signal with one of said bias signals in dependence on the polarity of the signal output of said summing means to provide said control signal, whereby said control signal will be increased in value over the output of said integrator by the magnitude of said bias signals in response to a positive input signal and said control signal will be decreased from the value of the output of said integrator by the value of said bias signals in response to a negative input signal.

* * * * *